United States Patent [19]
Carlson et al.

[11] Patent Number: 6,128,769
[45] Date of Patent: Oct. 3, 2000

[54] METHOD FOR ANALYZING AND EFFICIENTLY REDUCING SIGNAL CROSS-TALK NOISE

[75] Inventors: Roy Carlson, Hillsboro; Hans J. Greub, Cornelius, both of Oreg.

[73] Assignee: Intel Corporation, Santa Clara, Calif.

[21] Appl. No.: 09/001,257

[22] Filed: Dec. 31, 1997

[51] Int. Cl.$^7$ ...................................................... G06F 17/50
[52] U.S. Cl. .................................. 716/6; 716/18; 716/8; 703/19
[58] Field of Search .......................... 395/500.02–500.19, 395/500.34–500.37, 500.4; 716/1–21; 703/13–16, 19

[56] References Cited

U.S. PATENT DOCUMENTS

| | | |
|---|---|---|
| 4,827,428 | 5/1989 | Dunlop et al. . |
| 5,243,547 | 9/1993 | Tsai et al. ................................... 703/14 |
| 5,255,321 | 10/1993 | Murray et al. . |
| 5,446,674 | 8/1995 | Ikeda et al. . |
| 5,471,397 | 11/1995 | Hsieh et al. ................................. 716/5 |
| 5,477,460 | 12/1995 | Vakirtzis et al. ............................. 716/5 |
| 5,481,695 | 1/1996 | Purks ........................................ 703/15 |
| 5,535,133 | 7/1996 | Petschauer et al. . |
| 5,555,506 | 9/1996 | Petschauer et al. . |
| 5,568,395 | 10/1996 | Huang ........................................ 716/4 |
| 5,610,833 | 3/1997 | Chang et al. .............................. 716/11 |
| 5,654,898 | 8/1997 | Roetcisonender et al. . |
| 5,666,288 | 9/1997 | Jones et al. ................................ 716/17 |
| 5,751,597 | 5/1998 | Okano et al. . |
| 5,761,080 | 6/1998 | DeCamp et al. ............................. 716/5 |
| 5,983,006 | 11/1999 | Carlson et al. .............................. 716/4 |
| 5,987,241 | 11/1999 | Goldberg et al. .......................... 716/14 |
| 5,999,714 | 12/1999 | Conn et al. ................................. 716/2 |

OTHER PUBLICATIONS

Sengupta et al. ("Crosstalk driven routing device", IEEE 44th Proceedings of Electronic Components and Technology Conference, pp. 687–694, May 1, 1994).

Zhang et al. ("Minimization of delay and crosstalk in high–speed VLSI interconnects", IEEE Transactions on Microwave Theory and Techniques, vol. 40, No. 7, Jul. 1992, pp. 1555–1563).

Kuntal Joardar, "A Simple Approach to Modeling Cross–Talk in Integrated Circuits", IEEE Journal of Solid–State Circuits, vol. 29, No. 10, Oct. 1994, pp. 1212–1219.

Kumar Venkat et al., "Timing Verification of Dynamic Circuits", IEEE 1995, Custom Integrated Circuits Conference, pp. 271–274, May 1, 1995.

David L. Rude, "Statistical Method of Noise Estimation in a Synchronous System", IEEE Transaction on Components, Packaging and Manufacturing Technology, Part B, vol. 17, No. 4, Nov. 1994, pp. 514–519.

Hong You & Mani Soma, "Crosstalk Analysis of High–Speed Interconnects and Packages", IEEE 1990 Custom Integrated Circuits Conference, pp. 11.2.1–11.2.4, May 13, 1990.

Laszlo Gal, On–Chip Cross Talk—the New Signal Integrity Challenge, Motorola, Emerging Computing Operations, Austin, TX, IEEE 1995 Custom Integrated Circuits Conference, pp. 251–254, Jan. 1995.

Hewlett Packard, "Oscilloscopes", p. 143, "Logic Analyzers", pp. 330 & 334, Test & Measurement Catalog–Jan. 1994.

*Primary Examiner*—Paul R. Lintz
*Assistant Examiner*—Phallaka Kik
*Attorney, Agent, or Firm*—Blakely, Sokoloff, Taylor & Zafman, LLP

[57] ABSTRACT

In the present invention, a method is provided for analyzing signal noise caused by cross-coupling between an attacker signal line, upon which an attacker signal resides, and a victim signal line, upon which a victim signal resides. This method comprises selecting the victim signal, selecting the attacker signal, performing cross-talk attacker filtering on a plurality of signal lines to identify a first set of potential attacker signals on a first set of potential attacker signal lines that cause signal noise upon said victim signal, performing safety window filtering on a plurality of signals signal lines to identify a second set of potential attacker signals on a second set of potential attacker signal lines that cause signal noise upon the victim signal line, and reducing the effects of the signal noise on at least one of the victim signal lines.

13 Claims, 13 Drawing Sheets

METHOD FOR ANALYZING AND EFFICIENTLY REDUCING SIGNAL CROSS-TALK NOISE

BACKGROUND OF THE INVENTION

1. Field of the Invention

This invention relates generally to analyzing and reducing the effects of signal to signal cross-coupling, and more particularly, to reducing the noise problems induced by cross-talk by determining the worst case peak cross-talk noise experienced by a signal due to cross-coupling capacitances to other signals.

2. Description of the Related Art

In electronic circuit applications, such as sub-micron and PC-board circuits, signal to signal cross-talk is a problem that is very difficult to control and overcome. Often, a capacitance develops between two or more signals, called cross-capacitance. Due to cross-capacitance, transitions in one signal can influence the behavior of other signals. A signal whose behavior is influenced by the signal transitions of another signal, is called the victim signal. A signal that influences another signal by means of cross-talk is called the attacker signal. During different periods of the circuit operation, an individual signal can be a victim signal at one point in time and an attacker signal at another point in time.

Attacker signals can cause many problems such as: inadvertent transitions; transitions at wrong voltage levels; transitions too fast; transitions too slow; or noise problems included by signal to signal coupling capacitance, which can cause inadvertent state changes or erroneous satisfaction of logic conditions.

To date, the primary method of addressing cross talk problems has been essentially a trial and error approach. Currently, there are no automated methods to efficiently deal with the problems that are caused by cross-coupling signals. Generally, designers are reduced to predicting where cross-coupling may occur or only addressing the signals that are actually known to have cross-coupling tendencies, such as signal busses, which are generally known to have high coupling capacitance between adjacent bits, and very similar timing patterns.

The current methodology for analyzing signal cross-talk noise is to assume a lumped capacitance model, where all possible sources of cross-talk (attackers) switch at the same time with a specific worst case fast slope. A worst case peak cross-talk voltage on the victim node is calculated by summing the effects of all the individual attackers. Then, an attempt is made to prove that each coupling violation is false, which is an error-prone, time consuming, manual analysis. Furthermore, this process becomes more complex and inefficient as technology allows electronic circuits to become smaller and denser. The other approach to resolving problems under the lumped capacitance model involves simple attempts to eliminate cross-talk by changing the physical layout. This is also a highly inefficient procedure. The process of identifying and addressing the problems of cross-coupling induced signal noise with today's methods are, at best, guesswork, and they are inefficient.

The present invention is directed to overcoming, or at least reducing the effects of, one or more of the problems set forth above.

SUMMARY OF THE INVENTION

In the present invention, a method is provided for analyzing signal noise caused by cross-coupling between an attacker signal line, upon which an attacker signal resides, and a victim signal line, upon which a victim signal resides. This method comprises selecting the victim signal, selecting the attacker signal, performing cross-talk attacker filtering on a plurality of signal lines to identify a first set of potential attacker signals on a first set of potential attacker signal lines that cause signal noise upon said victim signal, performing safety window filtering on a plurality of signals signal lines to identify a second set of potential attacker signals on a second set of potential attacker signal lines that cause signal noise upon the victim signal line, and reducing the effects of the signal noise on at least one of the victim signal lines.

BRIEF DESCRIPTION OF THE DRAWINGS

Other objects and advantages of the invention will become apparent upon reading the following detailed description and upon reference to the drawings in which.

Figures 1, 1A:
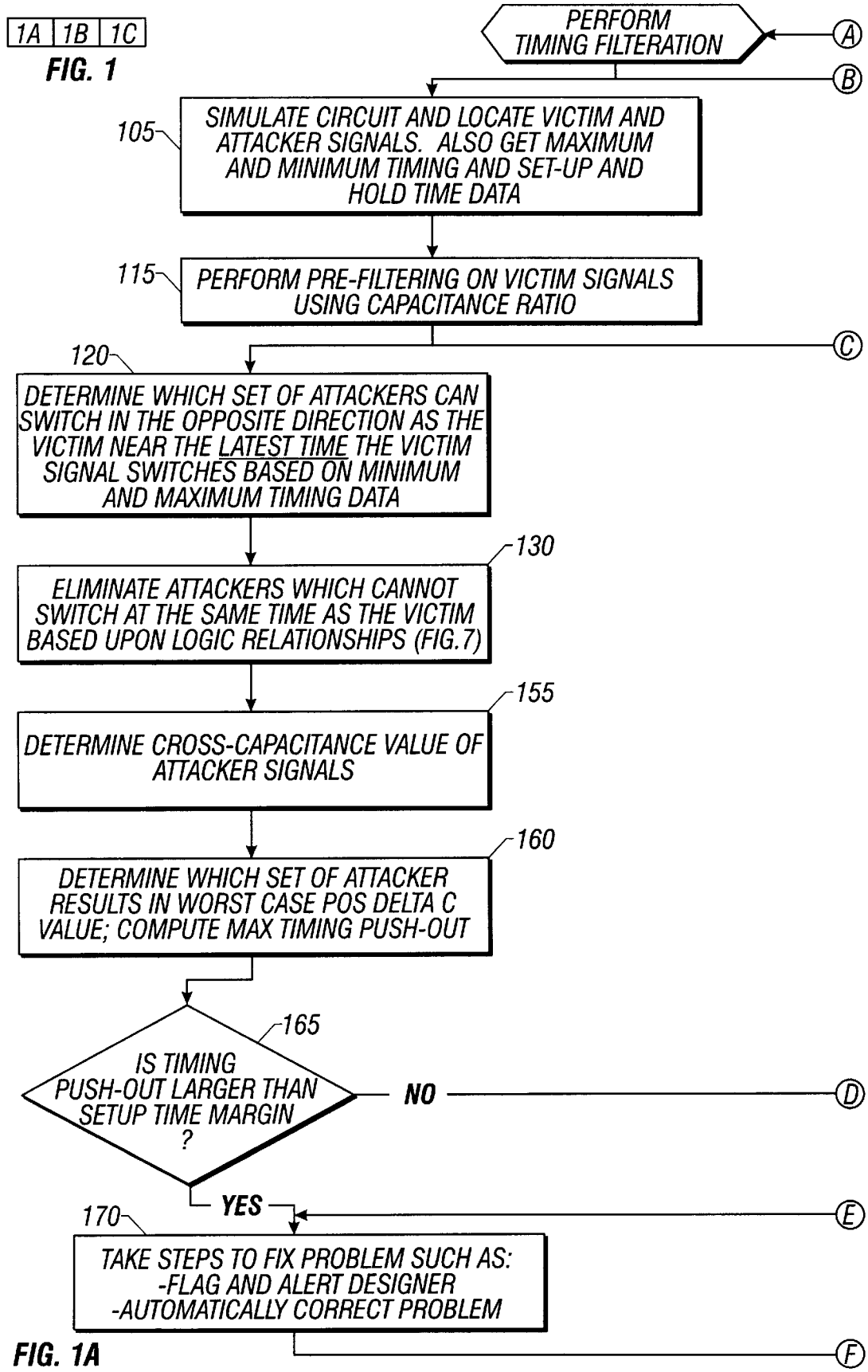
FIGS. 1A, B and C is a flow chart illustrating one method for performing timing filtration.
Figure 1B:
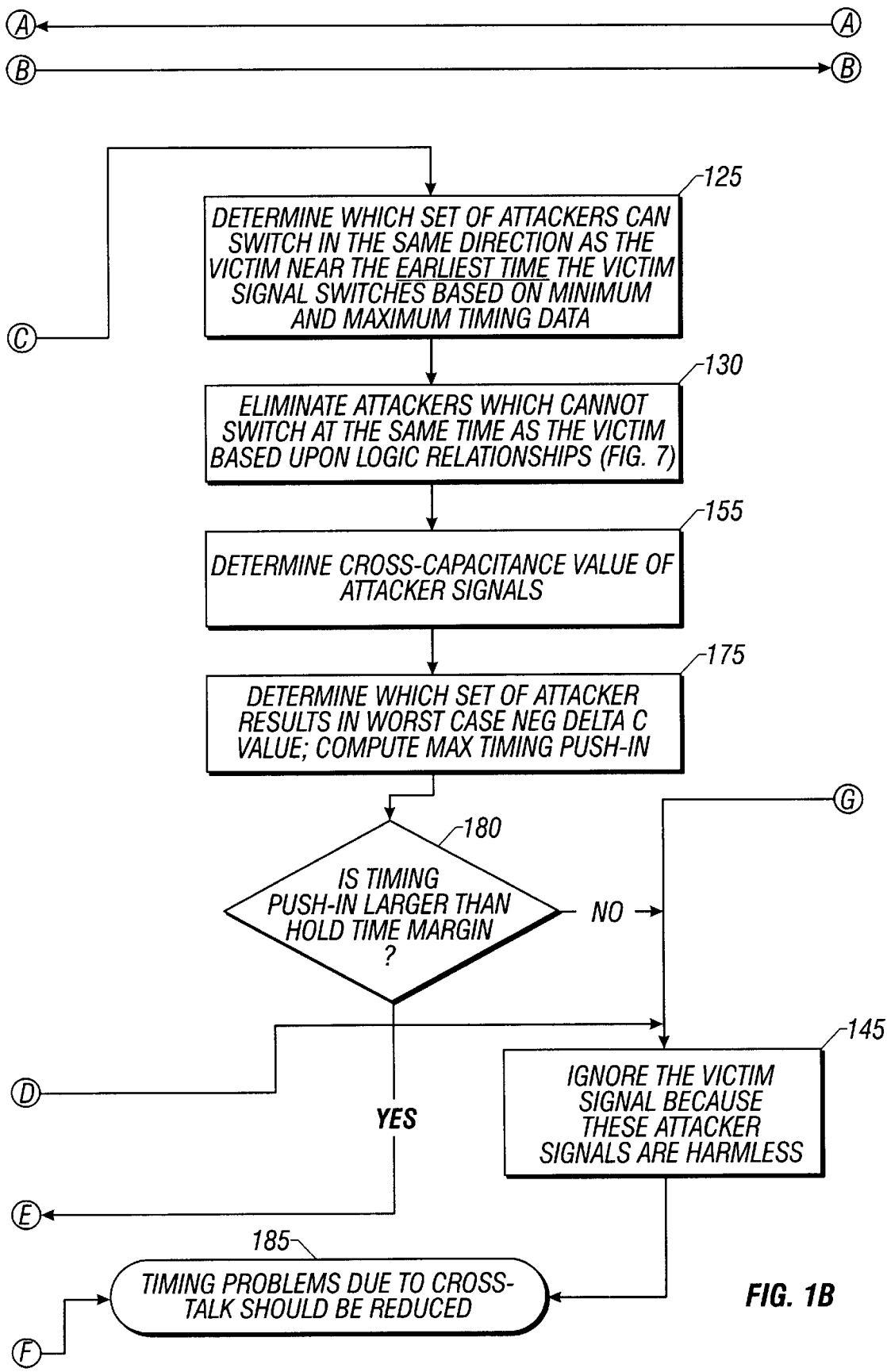
Figure 1C:
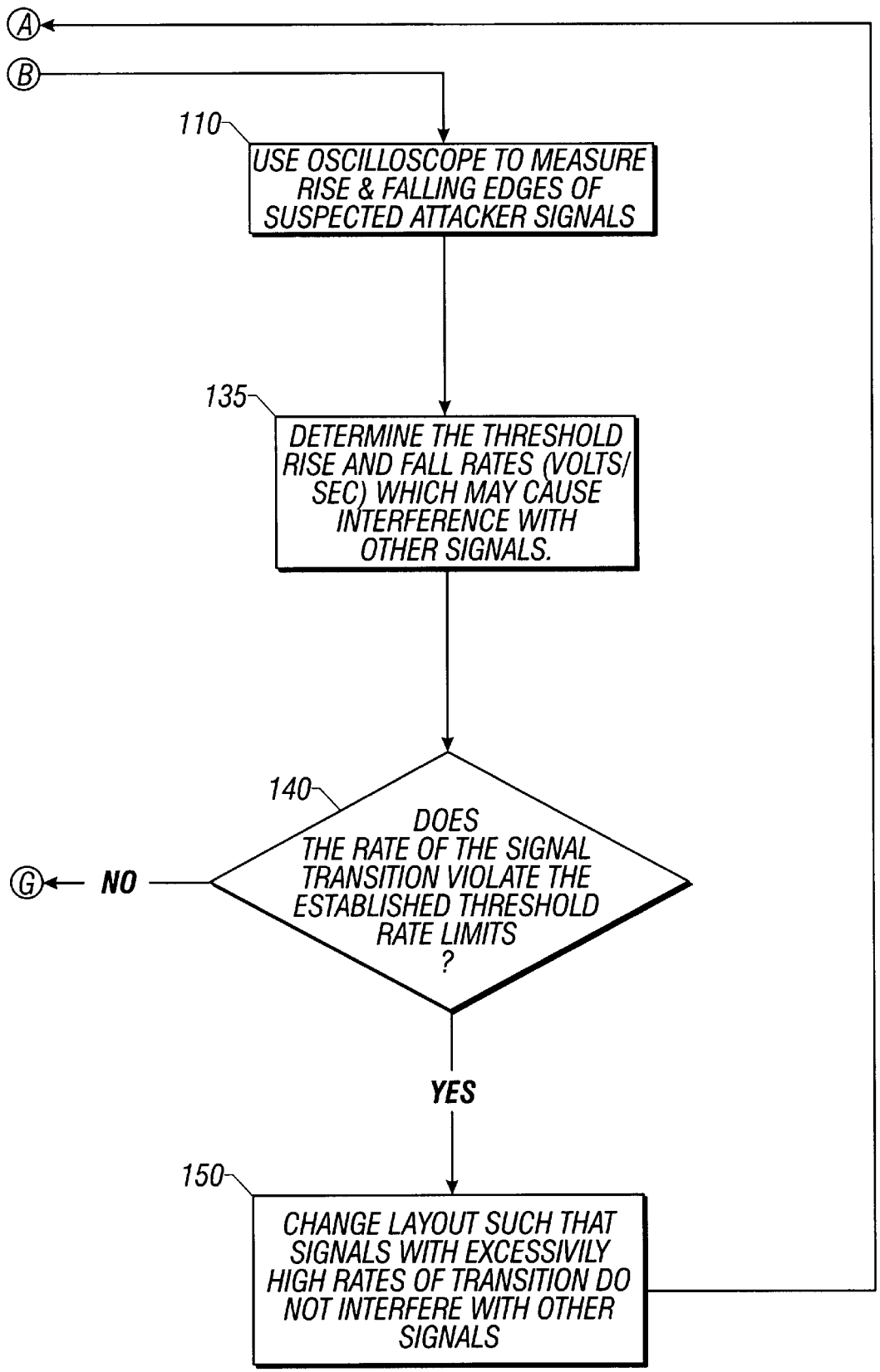

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

In electronic circuits, there are generally several signals that can cross-talk with other signals and create timing problems. These timing problems cause errors in the functionality of the electronic circuits. To more efficiently identify the signals that cause the timing problems, it is useful to perform timing filtering, logic filtering, cross-talk attacker filtering, and safety window filtering on the electronic circuits.

Figure 2:
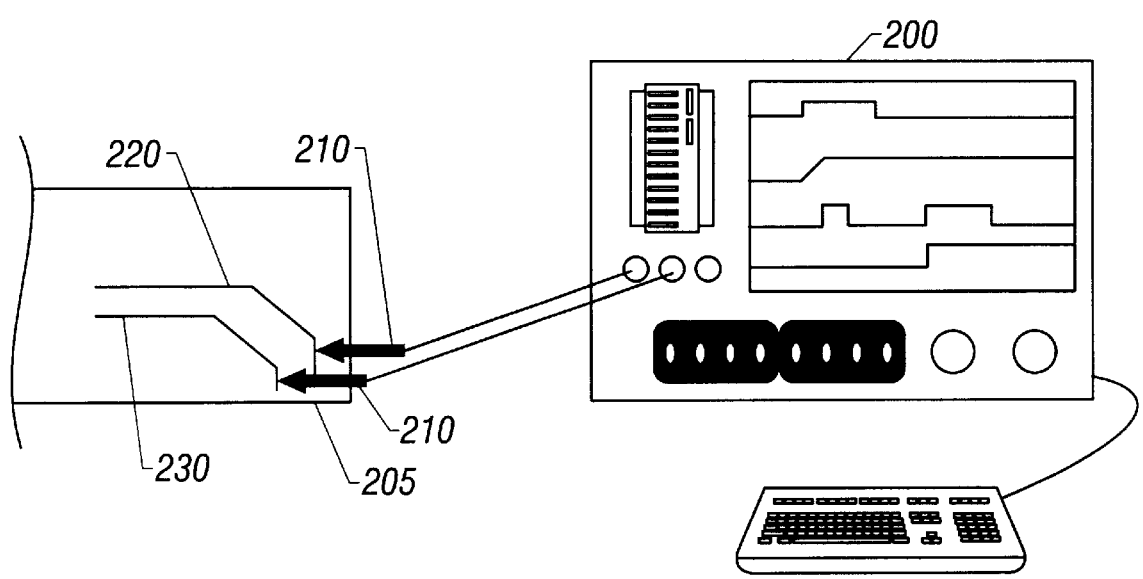
FIG. 2 illustrates a static timing device monitoring an attacker signal and a victim signal through signal probes.

Turning now to the drawings and referring to FIG. 1, a method for performing timing filtration is shown. Block 105 and block 110 illustrate the two procedures of timing filtration. One aspect of timing filtration, which is the analysis of the timing behavior patterns of various signals by using a static timing device, is initiated at block 105. The minimum and maximum timing data, as well as the set-up and hold time data, are also analyzed at this point. FIG. 2 illustrates a static timing device 200, a semiconductor device 205 (or a PC-board in an alternative embodiment), and signal probes 210 coupling the static timing device 200 to traces 220, 230 on the semiconductor device 205. Electrical signals are delivered over these traces 220, 230 and are generally identified herein as a victim signal and an attacker signal. In one embodiment, a primary method for analyzing and eliminating dynamic delay variation problems, includes performing timing filtering and logic filtering upon the victim signal and the attacker signal. To perform timing filtering, the victim signal and attacker signal are analyzed by using the static timing device 200.

The static timing device 200 is, in one embodiment, a simulation device that is capable of timing simulation. The victim signal and the attacker signal are connected to the static timing device 200 through the signal probes 210. The static timing device 200 is programmed to simulate the timing of the victim signal and the attacker signal. That is, the static timing device 200, in combination with a parasitic extraction tool, produces a victim signal and attacker signal similar to those present on the corresponding traces 220, 230 of the semiconductor device 205 during normal operation. Timing analysis is performed on the victim and attacker signal using the static timing device 200.

Using the static timing device 200, the minimum and a maximum delay, as well as the set-up time and hold time margins are found. This is done by using the static timing device 200 to simulate the behavior of the corresponding signals on the semiconductor device 205 during normal operation. The semiconductor device is assumed to be functional regarding its set-up time and hold time of its signals. The static timing device 200 facilitates the simulation of signals without having to simulate all possible input stimulus patterns. During the signal-behavior simulation conducted in the static timing device 200, the transitions of potential attacker signals and victim signals are monitored.

Using the static timing device 200, the behavior of the attacker signals can be analyzed and the number of attacker signals that merit further analysis can then be limited to those that could actually cross-couple with the victim signals. The static timing device 200 captures the earliest up and down switching events of signals, including transition times, called minimum timing. The static timing device 200 also captures the latest up and down switching, including transition times, called maximum timing. The minimum and maximum timings correspond to the hold and set-up timing, respectively, required to properly register signal transitions. Using the set-up and hold time specification of the downstream sampling elements, the worst case set-up and hold time margin for each signal can be established, thereby establishing the worst case maximum and minimum timings.

If a signal transition occurs after the maximum delay timeline 300 (shown in FIG. 3) plus the set-up time margin 310, a timing push-out error results because the electronic circuit would not have time to properly register the new state of the signal. If a signal transition occurs before the minimum delay timeline 400 (shown in FIG. 4) minus the hold time margin 410, a timing push-in error results because the electronic circuit could possibly register an incorrect signal level. A timing push-out can occur if the attackers causes the victim signal transition to occur outside the set-up time margin 310. A timing push-in error can occur when the attacker signals causes the victim signal transition to occur outside the hold time margin 410. If the timing of the victim signal is such that neither a timing push-in nor a timing push-out error occurs, therefore operating properly within the switching timing window (or timing window) 320, then the effects of the attacker signals can be ignored.

Referring back to FIG. 1, at block 115, pre-filtering upon the victim signals is performed using capacitance ratio. Consider a victim node that is held at logic low, and a first attacker signal cross-talks with the victim signal and causes a signal noise spike upon the victim node. The maximum voltage spike that the victim signal experiences is defined by Equation 1:

$$V_{ul} = (C_{cc}/C_{vn}) \times V_{ps};\qquad\text{Equation 1}$$

where $V_{ul}$ is the upper limit voltage of the signal noise spike experienced by the victim node, $C_{cc}$ is the cross-coupling capacitance experienced by the victim node, $C_{vn}$ is the capacitance of the victim node, and $V_{ps}$ is the power supply voltage. The upper limit voltage of the signal noise spike experienced by the victim node is directly proportional to the power supply voltage by a ratio of the cross-coupling capacitance and the victim node capacitance. Therefore, the upper limit voltage of the signal noise spike that the victim node experiences has a maximum value of that of the power supply voltage if the cross-coupling capacitance is the same as the victim node capacitance. If the voltage spike upon the victim signal is not appreciably high, then that signal can be eliminated as a victim signal.

A slow-down dynamic delay variation generally occurs when an attacker signal switches in the opposite direction as that of the victim signal. For example, the attacker signal switches from high-to-low at about the same time that the victim signal switches from low-to-high. This causes the victim signal to experience a signal-level pull in the direction of the attacker signal, forcing the driver (not shown) of the victim signal to drive more charge in order to switch the signal. Since the driver is required to drive more charge, it needs more time to drive the victim signal to the appropriate level, thereby causing the delay.

Figure 3:
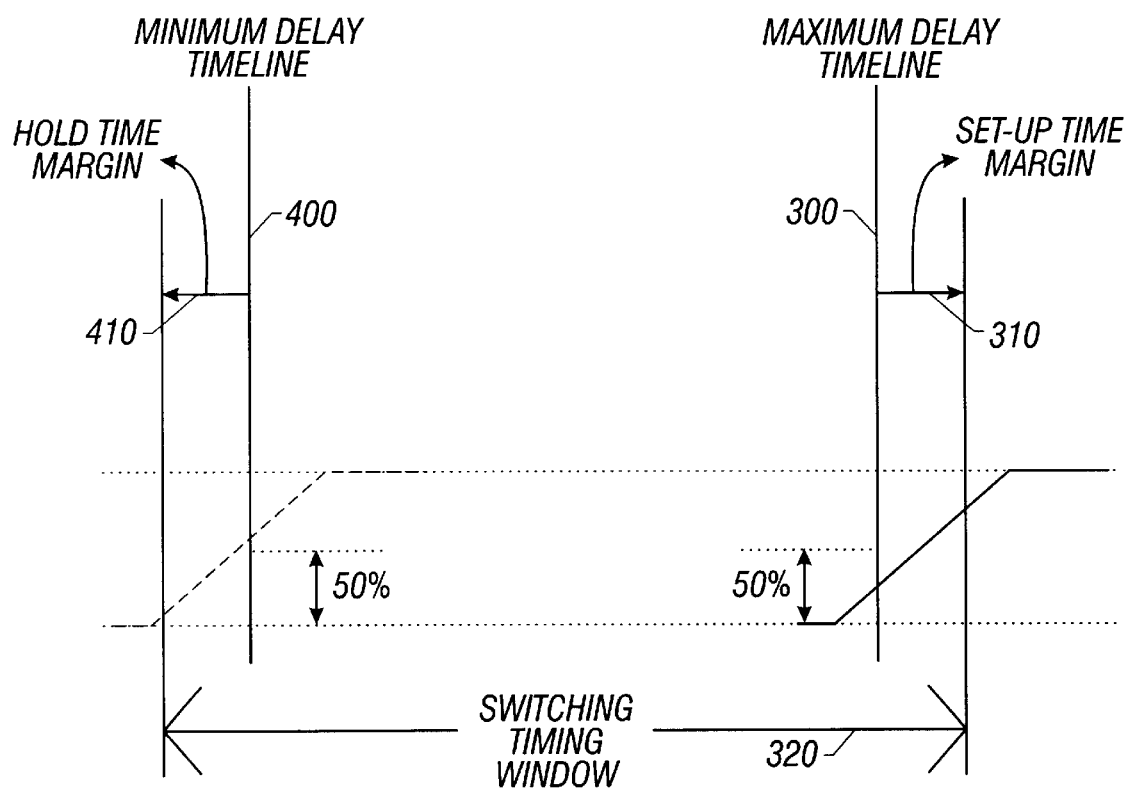
FIG. 3 shows a timing diagram in which a slow-down dynamic delay variation of a signal transition is illustrated.

One way to emulate this is by using the static timing device 200. If the static timing device 200 indicates that the victim signal does not complete its transition before a maximum delay, it can be concluded that the victim signal is experiencing a slow-down dynamic delay variation. A slow-down dynamic delay variation is shown in FIG. 3, where the victim signal fails to complete its transition before the maximum delay timeline 300 plus the set-up time margin 310.

A speed-up dynamic delay variation generally occurs when an attacker signal switches in the same direction as that of the victim signal. For example, both the attacker and victim signals switch from low-to-high at about the same time. The switching of the attacker signal causes a signal-level pulling effect upon the victim signal in the direction of the attacker signal's transition. Since the driver of the victim signal is driving it in the same direction as that of the signal-level pull caused by the attacker signal, the transition of the victim signal occurs too fast, thereby causing a speed-up dynamic delay variation.

Figure 4:
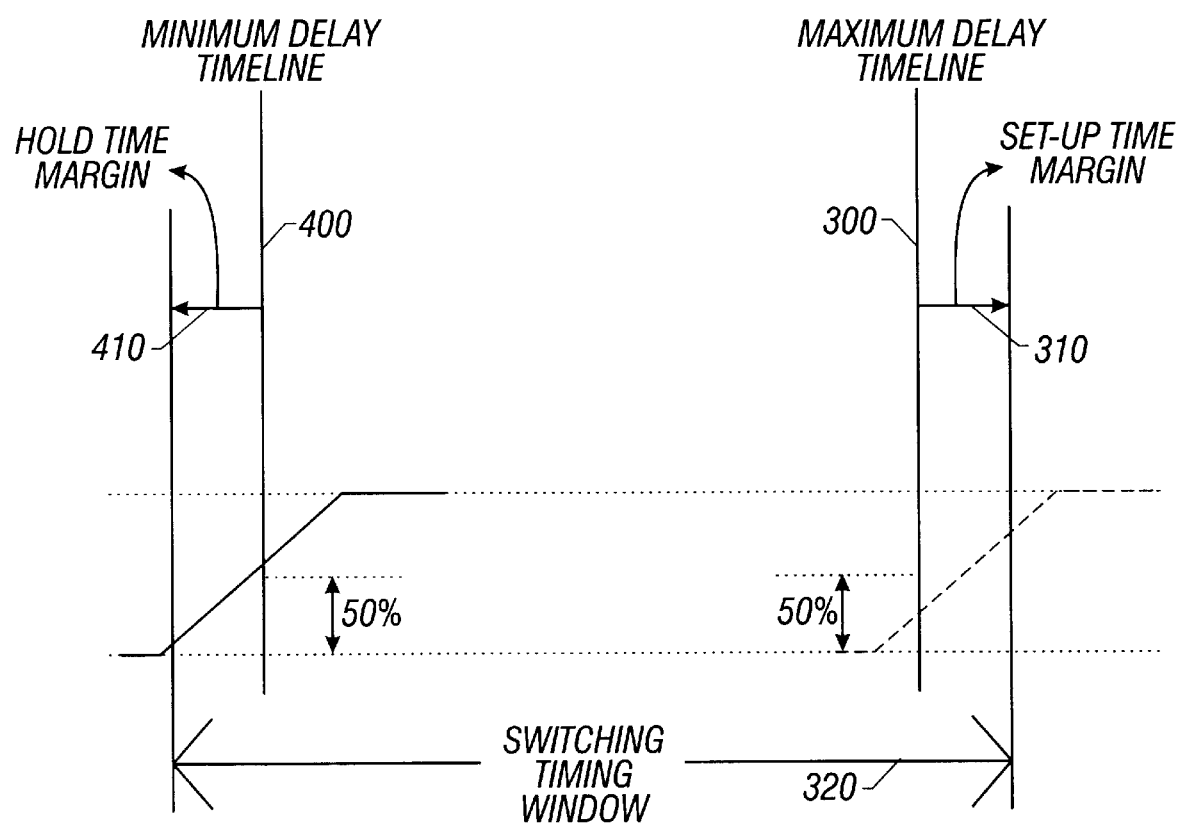
FIG. 4 shows a timing diagram in which a speed-up dynamic delay variation of a signal transition is illustrated.

One way to emulate this is by using the static timing device 200. When the static timing device 200 indicates that the victim signal has completed its transition before the minimum delay period, a speed-up dynamic delay variation has occurred, as specified at block 125. A speed-up dynamic delay variation is shown in FIG. 4, where the victim signal switches to a new voltage level before the minimum delay timeline 400 minus the hold time margin 410.

By studying the behavior of the victim signal, the cause of the dynamic delay variation, whether it is of the speed-up or the slow-down variety, can be found by analyzing the behavior of the attacker signals. Thus, the attacker signals that are causing timing problems are narrowed from a long list of potential attacker signals.

At block 120 of FIG. 1, a determination is made regarding which sets of attacker signals that are suspected of cross-talking with a victim signal, can switch in the opposite direction as that of the victim signal near the latest time that the victim signal switches, based on maximum and minimum timing data. Similarly, at block 125, a determination is made regarding which sets of attacker signals that are suspected of cross-talking with a victim signal, can switch in the same direction as that of the victim signal near the earliest time the victim signal switches. All suspected victim signals are cycled through these steps. The attacker signals that are found to not switch at the same time as the victim signal, based upon logic relationships between victim signals and attacker signal and relationship among attacker signals of a particular victim signal, can be eliminated, as described at block 130. This is illustrated by the example shown in FIG. 5.

Figure 5:
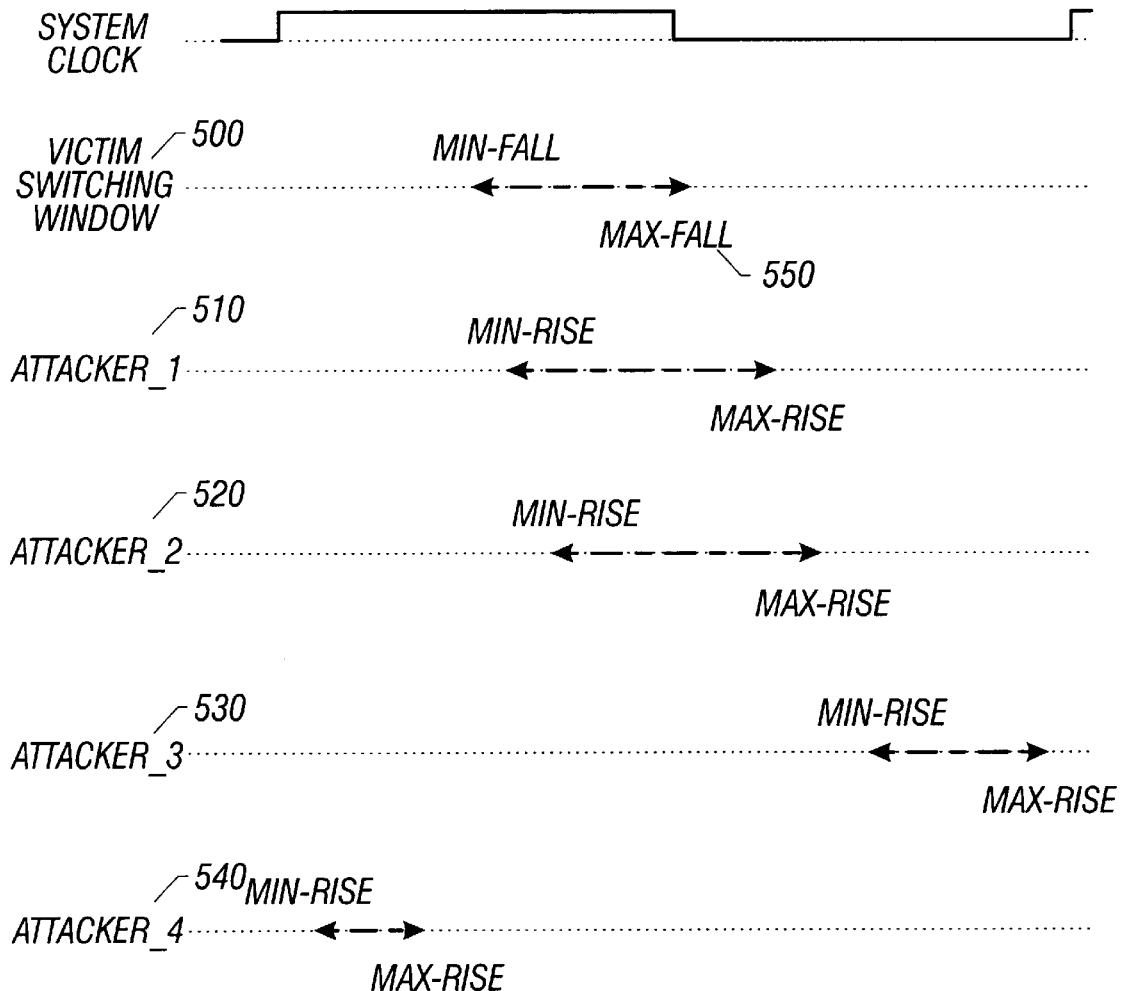
FIG. 5 illustrates an example of an application of timing filtration and logic filtration.

Turning now to FIG. 5, a victim switching window 500 and the transitions of four attacker signals are shown. In the example shown in FIG. 5, timing filtering can remove attacker_3 530 and attacker_4 540 from the set of potential attacker signals. This is true because attacker_3 530 and attacker_4 540 do not switch at the same time as the victim signal. Based upon maximum and minimum timing data, attacker_1 510 and attacker_2 520 could switch near the max-fall time 550 of the victim signal, thereby causing a timing push-out on the max-fall time 550 of the victim signal.

The maximum and minimum timing data provides an intermediate indication of the potential overlap. However, attacker_2 520 could be generated by an inverter, with its input connected to attacker_1 510 and still have shown the maximum and minimum timing windows. In this case, the application of logic filtering could detect this dependency and remove either attacker$_{13}$ 1 510 or attacker_2 520 depending on which one has a larger cross-capacitance to the victim signal. Alternatively, logic filtering would eliminate both attacker_1 510 and attacker_2 520 if the inverter delay is small compared to the max-fall 550 transition time of the victim signal.

At block 110 in FIG. 1, a description of another aspect of timing filtering, analyzing the rising and the falling slopes of the transitions of potential attacker signals, is specified. The faster a signal switches, the more likely that it can interfere with another signal. Therefore, signals that have fast rising or falling transition slopes, like clock signals, should be analyzed further, while signals with relatively slow rising and falling edges may be filtered out.

Figure 6:
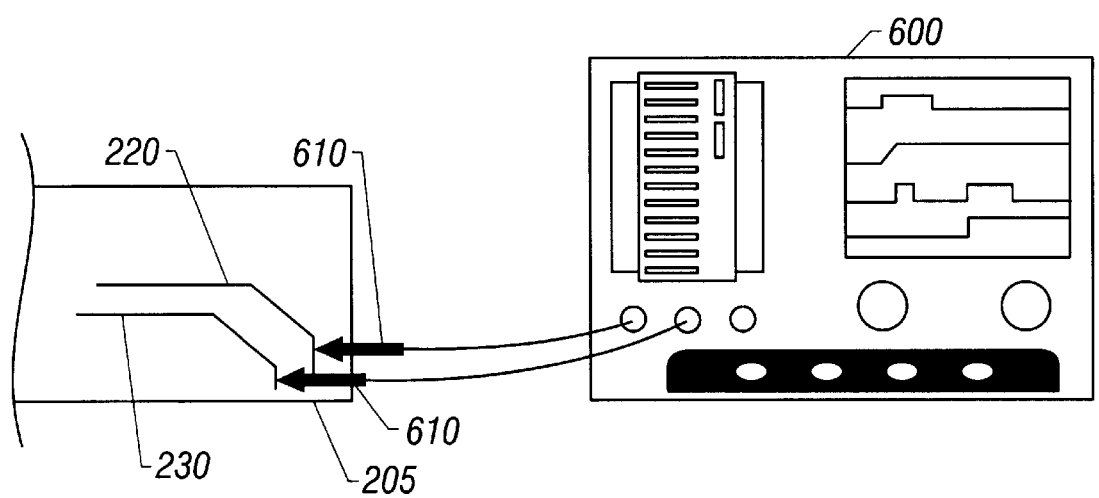
FIG. 6 illustrates an oscilloscope monitoring an attacker signal and a victim signal through oscilloscope signal probes.

Turning now to FIG. 6, an apparatus useful in performing a method for measuring the rising and the falling slopes of potential attacker signals to perform timing filtering, is shown. The potential attacker signal on the trace 230 is connected to an oscilloscope 600, through oscilloscope signal probes 610. As specified at block 135 in FIG. 1, a threshold rise and fall rate (Voltage per second), that may cause cross-talk problems, is determined. The transitions of the attacker signals are monitored on the oscilloscope 600. The rising and falling slopes of the potential attacker signals are then measured on the oscilloscope 600. At block 140, a determination is made regarding whether the rate of the attacker signal's transition exceeds the pre-determined threshold rise and fall rate. Potential attacker signals are then filtered out if their slopes are not relatively fast, as specified at block 145 of FIG. 1. For example, in one embodiment of the invention, potential attacker signals are filtered out if their slope is slower than a predetermined rate (voltage per second). If it is determined that the rate of the transition of the attacker signals exceeds the pre-determined threshold rates, then some signal layout changes may be necessary to eliminate cross-talk problems, as specified at block 150.

Once a group of attacker signals are identified by using the timing filtration method, steps are taken to emulate their adverse effects on the minimum and maximum timing of the victim signals. One method of emulating the impact of the effects that the attacker signals have on the victim signal line, is manipulating its capacitance value. At block 155 of FIG. 1, the cross-capacitance value of the attacker signals are determined. The next step is to add the value of cross-coupling capacitance to Delta C Value. Delta C Value is the summation of the cross-coupling capacitances of all attacker signal lines, which have been through the timing and logic filtration processes, corresponding to a victim signal line.

During evaluation, in the case where the victim signal is experiencing a speed-up dynamic delay variation, the Delta C Value is added to the victim node. This causes a slow down of the transition of the victim signal, causing the switching of the victim signal to conform to the minimum delay. The added value of Delta C Value slows down the transition of the victim signal. The added capacitance forces the driver to drive more charge to complete the transition, thereby slowing down the transition and bringing it within the proper switching timing window 320.

During evaluation, in the case where the victim signal is experiencing a slow-down dynamic delay variation, Delta C Value is subtracted from the victim node. This causes a speed-up of the transition of the victim signal, causing the switching of the victim signal to conform to the maximum delay. The decrease in the capacitor value due to the subtraction of the Delta C Value speeds up the transition of the victim signal. The decrease in the victim trace capacitor value will decrease the amount of charge that the driver has to drive to make a transition, thereby speeding up the transition and bringing it within the proper switching timing window 320.

Furthermore, applying logic filtering can divide groups of attacker signal lines into different subsets. The subset of attacker signal lines that yields the highest Delta C Value is chosen as the worst case Delta C Value. In the case where the attacker signals switch near the latest time the victim signal switches (as described at block 120), the worst case positive Delta C value is determined along with the maximum push-out due to the worst case Delta C, as described at block 160.

At block 165, a determination is made whether the timing push-out caused by the application of the Delta C value is larger than the setup-time margin 310. If it is determined that the timing push-out is not larger than the setup-time margin 310, then there will be no timing problems for that particular victim signal. Thus, the effect of the potential attacker signals can be ignored, as described at block 145.

Conversely, if it is determined that the timing push-out is larger than the set-up margin 310, then steps to fix the timing problem must be taken, as described at block 170. These steps include alerting the designer so manual steps may be taken, and automatically correcting the timing problems. The automatic correction of the problems include: modifying the layout to reduce cross-talk from fast switching attackers; increasing the victim signal's driver-strength to reduce the timing push-out; and slowing down attacker signals that have large set-up margins.

In the case where the attacker signals switch near the earliest time the victim signal switches (as described at block 125), the worst case negative Delta C value is determined along with the maximum push-in due to the worst case Delta C, as described at block 175.

At block 180, a determination is made whether the timing push-in caused by the application of the Delta C value is larger than the hold time margin 410. If it is determined that the timing push-in is not larger than the hold time margin 410, then there will be no timing problems for that particular victim signal. Thus, the effect of the potential attacker signals can be ignored, as described at block 145.

Conversely, if it is determined that the timing push-in is larger than the hold time margin 410, then steps to fix the timing problem must be taken, as described at block 170. These steps include alerting the designer so manual steps may be taken, and automatically correcting the timing problems. The automatic correction of the problems include: modifying the layout to reduce cross-talk from fast switching attackers; increasing the victim signal's driver-strength to reduce the timing push-out; and slowing down attacker signals that have large set-up margins. All of these steps can be performed iteratively until timing problems are reduced. At this point timing problems due to cross-talk should be reduced, as described at block 185.

Figure 7:
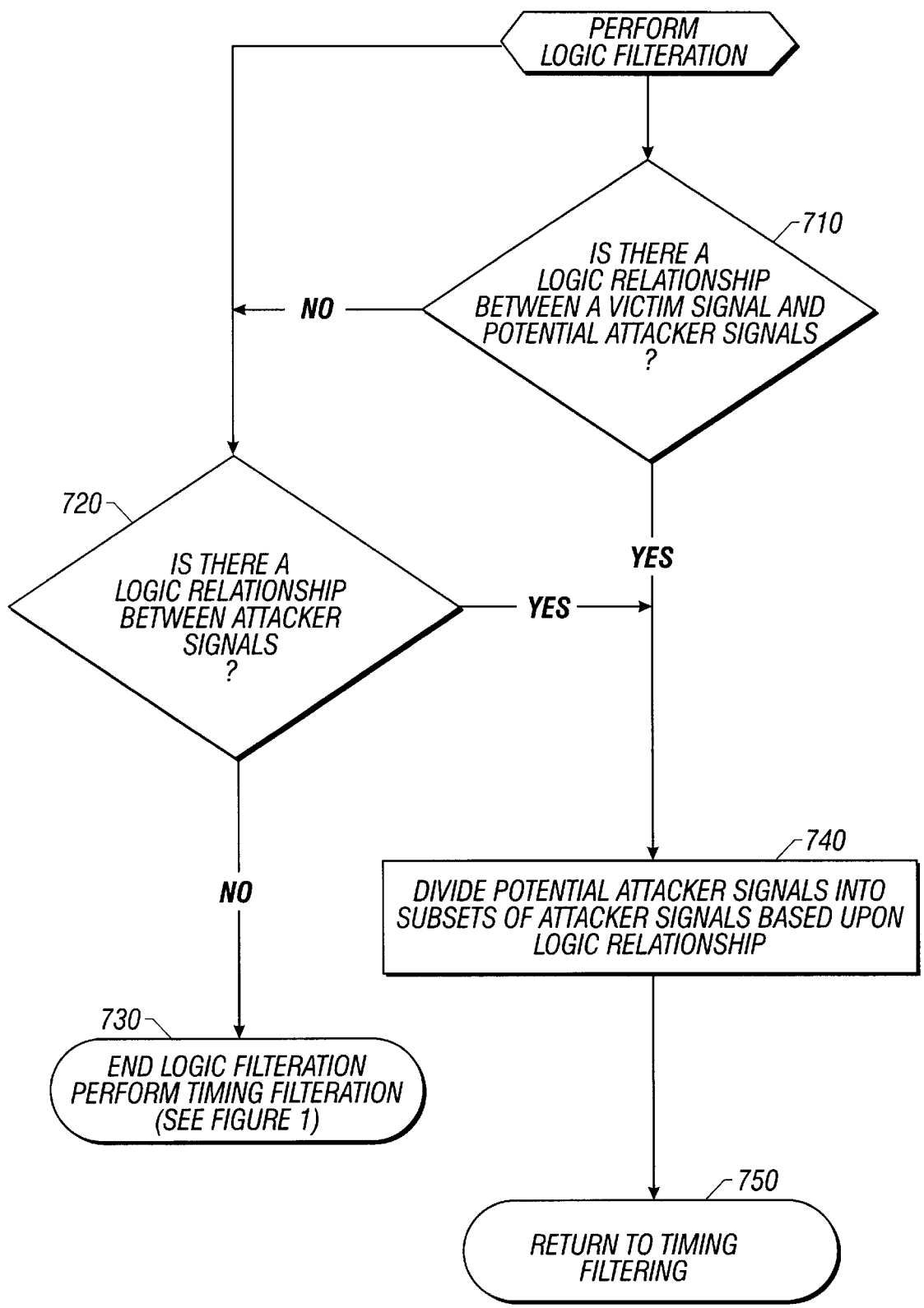
FIG. 7 is a flow chart illustrating one method for performing logic filtration.

Another method of efficiently checking for true attacker signals is to perform logic filtering. Logic filtering consists of analyzing the logical relationship between signals. FIG. 7 illustrates one method for logic filtration. At block 710, a determination whether there exists a logic relationship between a victim signal and a potential attacker signal is made. At block 720, a determination is made whether there is a logic relationship between attacker signals. If it is determined that there is no logic relationship between a victim signal and a potential attacker signal, nor there is a logic relationship between potential attacker signals, then at block 730 logic filtration is terminated and timing filtration may be initiated.

Figure 8:
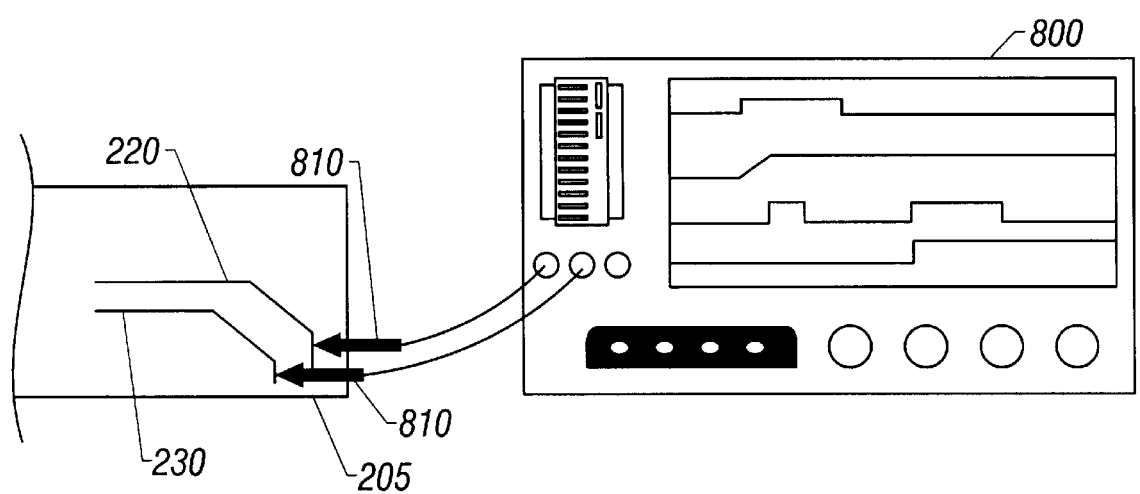
FIG. 8 illustrates a logic analyzer device monitoring an attacker signal and a victim signal through logic analyzer signal probes.

One method of performing logic filtering is by using a logic analyzer to study the relationship between signals. Turning now to FIG. 8, the victim signals and the attacker signals are connected to a logic analyzer 800 through logic analyzer signal probes 810. Logic filtering is performed to eliminate potential attacker signals that have no logic relationship with the victim signals or group attacker signals together that have a logic relationship.

Once it is determined that a logic relationship exits between a victim signal and a potential attacker signal or between potential attacker signals, at block 740 the potential attacker signals are divided into subsets of attacker signals, based upon logic relationships. This information is used in the timing filtration process, as described at block 750. Specifically, logic filtration is utilized at block 130 of FIG. 1 (Timing Filtration). The subset of attacker signal with the worse case Delta C value is used for timing filtration.

Signal to signal cross-coupling can also cause signal noise problems. The cross-coupling of an attacker signal onto a victim signal can result in signal noise on the victim signal such that it results in a false transition. This false transition, sometimes in the form of a glitch, can cause an inadvertent change of state or an erroneous satisfaction of a logic condition. In one embodiment, two primary ways to address the problem of signal noise caused by attacker signals include performing cross-talk attacker filtering and safety window filtering.

Figure 9A:
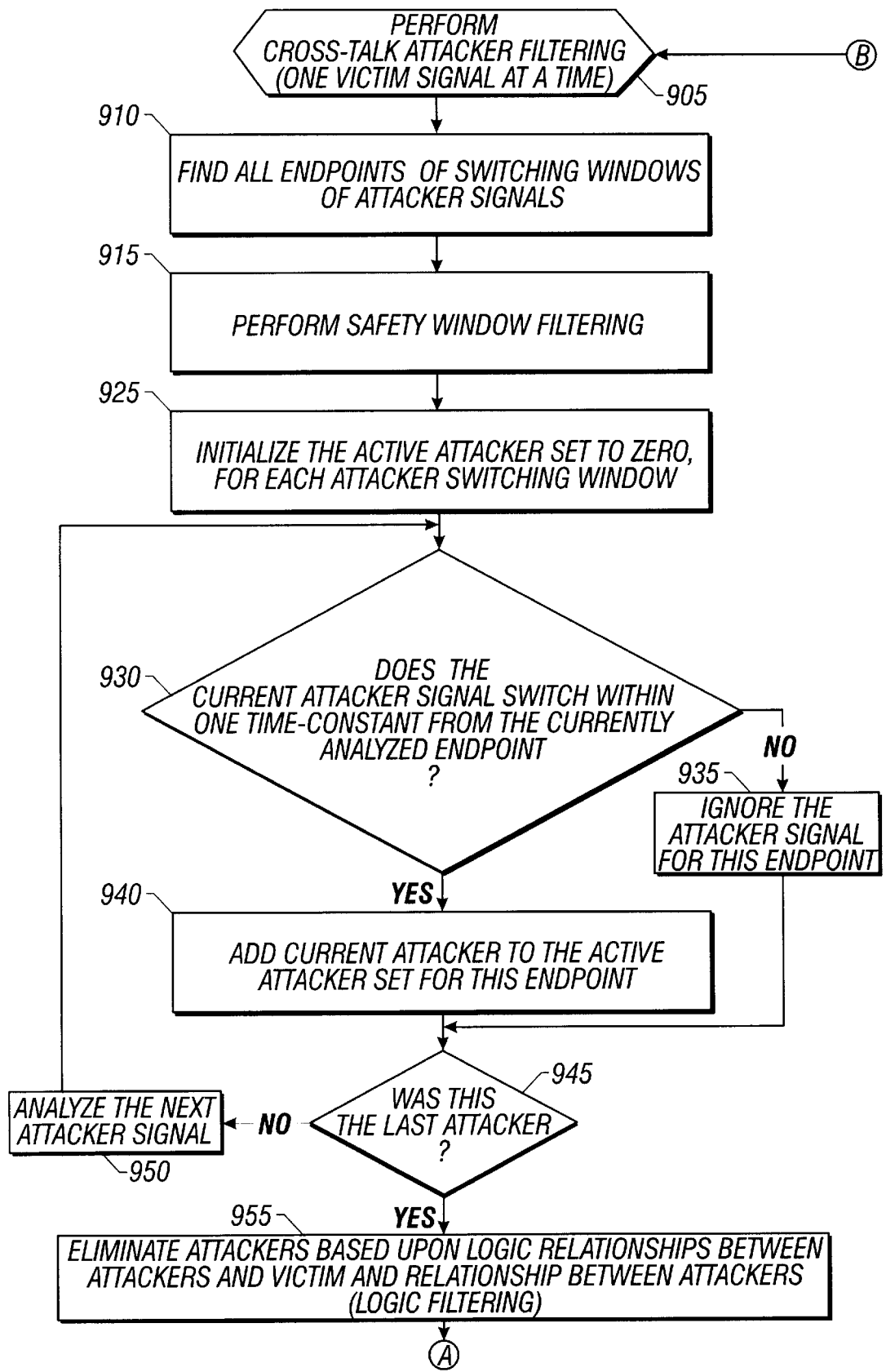
FIGS. 9A and 9B is a flow chart illustrating one method for performing time-constant analysis.
Figure 9B:
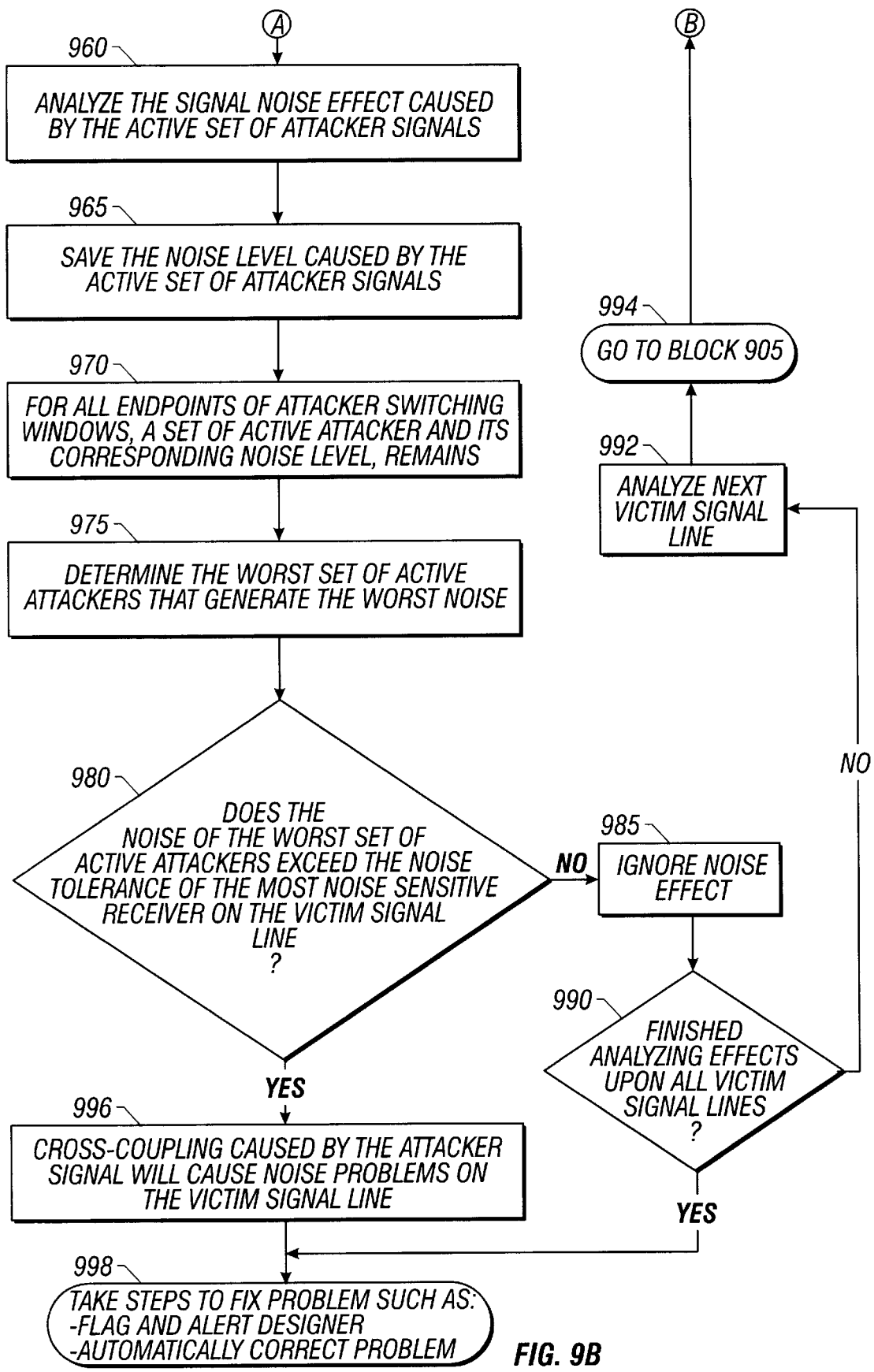

Turning now to FIG. 9, a method of performing cross-talk filtering is shown. Block 905 initiates cross-talk attacker filtering upon one victim signal at a time. At block 910, the endpoints of the switching window of attacker signals are found. The endpoints correspond to the minimum and maximum delay lines discussed above and described in FIGS. 3 and 4. In order to reduce the number of endpoints to be analyzed, safety window filtering is initiated at block 915 of FIG. 9.

Figure 10:
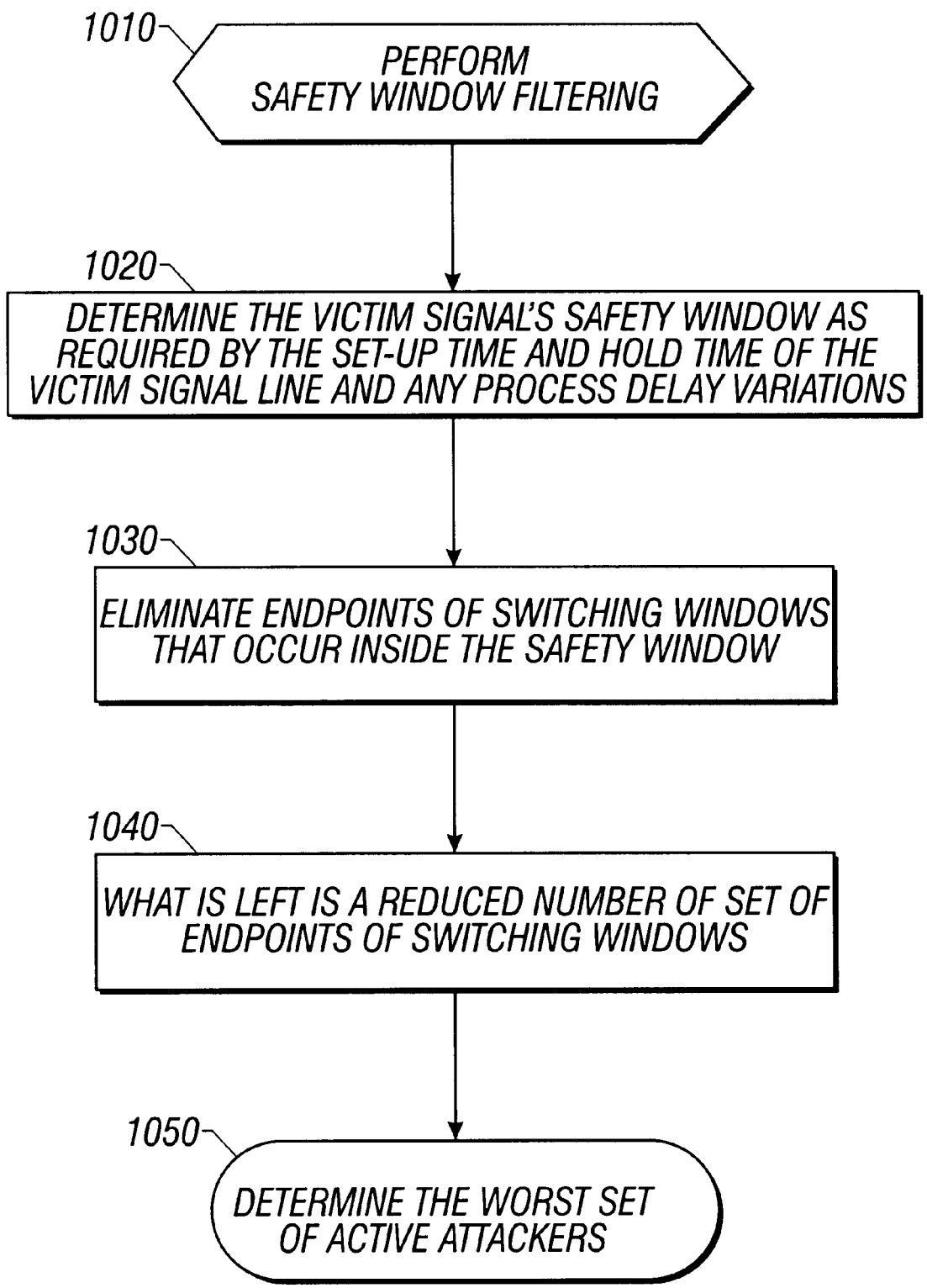
FIG. 10 is a flow chart illustrating one method for performing slope analysis.

Turning now to FIG. 10, a method of performing safety window filtering is shown. At block 1010, safety window filtering is initiated. At block 1020, the victim signal's safety window is determined. It is important to determine whether the signal noise on the victim signal line occurs during the period of time when it will not cause any timing problems. This period of time is called the safety window.

The safety window is the complement of the required time during which the signal is required to stay high or low, in order to avoid timing violations. The required times can be obtained or inferred by the data from the static timing analyzer 200. The composition of the safety window includes factors such as set-up and hold time of the victim signal line, and may include consideration of any process delay variations, such as clock skew and data skew. Process delay variations are differences in the nominal value of the timing characteristics of signals due to the variations in electronics manufacturing processes.

At block 1030, the endpoints of the switching window that occur inside the safety window are eliminated. The safety window will encompass a period of time when a signal will make a transition, known as the switching window. The switching window includes the time needed for a complete transition, the set-up time and the hold-time. During the duration of the switching window, a signal noise, such as a glitch, upon the victim signal line will generally not cause any problems. This is true because the victim signal is being driven into a transition and could switch to the desired level despite a signal noise.

Once the safety window is established, a determination is made whether the signal noise generated by the attacker signal is occurring during this window. Therefore, the attacker signal's transition is analyzed and a determination is made regarding whether this transition occurs during the victim signal's safety window. More specifically, a determination is made whether the attacker signal's minimum-maximum switching windows, as shown in FIG. 3 and FIG. 4, fall within the safety window. This determination ensures that any cross-coupling induced signal noise that the attacker signal causes, will occur only during the safety window.

Once it is determined that the attacker signal's minimum-maximum switching windows fall within the safety window, then the cross-coupling effect induced by the attacker signal can be ignored. Hence, the endpoints of the switching windows that occur inside the safety window can be eliminated, as described at block 1030.

In the event that it is determined that the attacker signal's minimum-maximum switching windows fall outside the safety window, then signal noise problems on the victim signal line must be anticipated. This is true because when the victim signal line is not in the safety window, it is not in the process of making a transition. Therefore, the victim signal line is expected to be in a particular signal level when it is not in the safety window. If the victim signal line is expected to be at a signal level, and a cross-coupling induced signal noise, such as a glitch occurs, an error may occur in the circuitry because a false signal level may be reported. Thus, when a victim signal line is not in its safety window, any cross-coupling may cause signal noise problems.

After eliminating the endpoints of switching windows that occur inside the safety windows, what is left is a reduced number of set of endpoints of switching window that occur outside the safety window, as described at block 1040. Once the group of endpoints of attacker switching windows are narrowed down to a group that occur only outside the safety window, the worst set of active attackers (the ones with the worst noise) are determined, as described at 1050. This concludes the performing of safety window filtering.

Each endpoint will have an active attacker set. Turning back to block 925 of FIG. 9, the active attacker set for each attacker switching window is set to zero. The resistor-capacitor (RC) time-constant of the victim signal line is calculated.

An aspect of time-constant analysis, which is the analysis of the timing behavior patterns relative to the resistor-capacitor (RC) time-constant of various signals, is performed. Using an equivalent capacitance and resistance experienced by the signal line upon which the victim signal resides (victim signal line), the time-constant of the victim signal line is determined at block 925. The time-constant of the victim signal line is defined by Equation 1:

$$\tau = R \times C;\qquad\text{Equation 1}$$

where $\tau$ is the time constant, R is the equivalent resistance of the victim signal line, and C is the equivalent capacitance of the victim node.

Block 930 requires a determination of whether the current attacker signal switches within one time-constant from the currently analyzed endpoint. That is, a determination is made whether the switching of the attacker signal and the occurrence of the endpoint of the switching window are separated by $\tau$. If they are indeed separated by a time-constant $\tau$, then the signal noise effects are non-additive. This is true because after the occurrence of the first cross-coupling event, the victim signal line has sufficient time to recover and return to its original state before the occurrence of the next cross-coupling event. Since the victim signal line recovers before the occurrence of the second cross-coupling event, the signal noise effect of the first and the second cross-coupling events are non-additive.

Consider a victim signal line that is held at a logically low state, and a first attacker signal cross-talks with the victim signal and causes a signal noise spike upon the victim signal line. The maximum voltage spike that the victim signal experiences is defined by Equation 2:

$$V_{ul} = (C_{cc}/C_{vn}) \times V_{ps};\qquad\text{Equation 2}$$

where $V_{ul}$ is the upper limit voltage of the signal noise spike experienced by the victim signal line, $C_{cc}$ is the cross-coupling capacitance experienced by the victim signal line, $C_{vn}$ is the capacitance of the victim signal line, and $V_{ps}$ is the power supply voltage. The upper limit voltage of the signal noise spike experienced by the victim signal line is directly proportional to the power supply voltage by a ratio of the cross-coupling capacitance and the victim signal line capacitance. Therefore, the upper limit voltage of the signal noise spike that the victim signal line experiences, has a maximum value of that of the power supply voltage if the cross-coupling capacitance is the same as the victim signal line capacitance. The period of time that is required for the victim signal line to recover back down to a logically low state from the upper limit voltage spike depends upon the time-constant of the victim signal line, which is described by Equation 3:

$$V_f = V_{ul} \times e^{-(t/\tau)};\qquad\text{Equation 3}$$

where $V_f$ is the final voltage of the victim signal line after it has recovered from the upper limit voltage spike, $V_{ul}$. The time that it takes the victim signal line to recover back to its original state after a voltage spike is described in Equation 4:

$$t = \tau \times ln(V_{ul}/V_f);\qquad\text{Equation 4}$$

where t is the time that is required for the voltage of the victim signal line to recover from a voltage spike. The recovery time t, is directly proportional to the victim signal line's time-constant, $\tau$.

After the expiration of at least one time-constant, if the victim signal line experiences another voltage spike due to a second attacker signal, the effect of the second attacker signal is non-additive relative to the effect of the first attacker signal. This is true because by the expiration of at least one time-constant, the victim signal line would have sufficiently recovered from the voltage spike of the first attacker signal. Since the effect of the second attacker only appears after the victim signal line has recovered from the effect of the first attacker, the effects are non-additive. Therefore, if at block 930 it is determined that the current attacker signal does not switch within one time-constant from the currently analyzed endpoint, then the attacker signal for this endpoint can be ignored, as described at 935.

Conversely, at block 930, it may be determined that the current attacker does switch within one time-constant from the currently analyzed endpoint. When a second attacker signal causes a signal noise effect on the victim signal line before the expiration of at least one time-constant after the first signal noise effect was induced by the first attacker signal, then the resulting signal noise effect is additive. This is true because before the expiration of at least one time-constant, the signal noise on the victim signal line is still present when the signal noise from the second attacker appears, even though the noise from the first attacker signal is decaying, as described in Equation 3. Thus, the two signal noise voltages are additive. Due to the overlapping of the signal noise effects induced by the first and the second attacker signals, both attacker signals can be viewed as occurring simultaneously.

There may exist several attacker signals that could occur simultaneously and contribute to the additive signal noise effect that the victim signal line experiences. The timing characteristics of all the attacker signals that could cross-talk within the time period of one time-constant of the original attacker signal, thereby producing additive signal noise effects, should be analyzed. If at block 930 it is determined that the current attacker does switch within one time-constant from the currently analyzed endpoint, then the current attacker is added to the active attacker set for this endpoint, as described at block 940.

A determination is then made whether this was the last attacker that is to be analyzed, as described at block 945. If this was not the last attacker signal to be analyzed, then the next signal should be analyzed, as described at block 950, and time-constant analysis should be performed, as described at block 930. Otherwise, a logic filtration process should be initiated, as described at block 955. This step calls for the elimination of attackers based upon logic relationships between attacker signals and victim signals, and between attacker signals in a set, as described at block 955.

Occasionally, there may be an attacker signal that produces a transition in the opposite direction of that of a second attacker signal during the same time period. The transition of the second attacker signal will have the effect of negating the cross-talking effect of the first attacker signal. Thus, this pair of attacker signals can be eliminated from further timing analysis procedures.

At block 955, the signal noise effect caused by the active set of attacker signals is analyzed. These noise levels are recorded and saved for further analysis, as described at block 960.

What remains now is a set of active attacker signals and their corresponding noise level data, for each endpoint of the attacker switching windows, as described at block 970. The set of active attackers that generate the worst noise is then determined, as described at block 975. That is, the set of active attackers that generate the type of signal noise that creates the biggest impact on the victim signal line.

A determination is then made regarding whether the noise of the worst case set of active attackers exceeds the noise tolerance of the most sensitive receiver on the victim signal line, as described at block 980. If it does not, then the noise effect of that particular set of active attackers is ignored, as described at block 985. Then a determination is made (at block 990) whether the cross-coupling effects upon all victim signal lines have been analyzed. If the cross-coupling effects upon all victim signals have not been analyzed, then the next victim signal line is analyzed by performing cross-talk attacker filtering, as described at block 992 and block 994. Otherwise, all filtering processes are stopped and steps to fix any existing cross-coupling problems are initiated, as described at block 998.

If at block 980, it is determined that the noise caused by the worst case active attackers exceeds the noise tolerance of the most sensitive receiver on the victim signal line, then it can be concluded that cross-coupling caused by the attacker signal will cause noise problems on the victim signal line, as described at block 996. Steps are then taken to eliminate, or at least reduce, cross-coupling noise problems, as described at block 998. These steps include alerting the designer so manual steps may be taken, and automatically correcting the timing problems. The automatic correction of the problems include: modifying the layout to reduce cross-talk from fast switching attackers; increasing the victim signal's driver-strength to reduce the timing push-out; and slowing down attacker signals that have large set-up margins.

The entire process, of timing filtering, logic filtering, adding the Delta C Value, subtracting the Delta C Value, performing cross-talk attacker filtering, and performing safety window filtering, can be repeated until all of the victim signal lines are sufficiently operating inside an acceptable timing window 310. Thus, the chance of producing an uncontaminated design with no hidden speed paths and no hold time problems, is dramatically improved.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method for analyzing cross-coupling induced signal effects between attacker signal lines and a victim signal line comprising:

simulating victim and attacker signals on the victim signal line and attacker signal lines, respectively;

determining a switching window for the victim signal, which identifies a safety window for the victim signal;

determining a switching window for each of the attacker signals;

performing safety window filtering on the attacker signal lines to remove attacker signal line or lines having a corresponding switching window residing within the safety window;

identifying from remaining attacker signal line or lines attacker signal or signals having a respective switching point within one time constant outside of the safety window;

analyzing effects of the attacker signal or signals having the switching point within one time constant outside of the safety window to determine a cumulative cross-coupling effect on the victim signal line;

determining the effect of the cumulative cross-coupling onto the victim signal line.

2. The method of claim 1 wherein determining each switching window includes determining respective beginning and end signal transitions, including timing variations introduced by hold time and set-up time margins.

3. The method of claim 2 wherein the one time constant is determined by a RC time constant of a signal line receiving the cross-coupled effect.

4. The method of claim 2 wherein the one time constant is determined by a RC time constant of the victim signal line and attacker signal switching point or points residing farther than the one time constant from the safety window are ignored in analyzing the cross-coupling effect, if not within another RC time constant of an attacker signal switching point having cross-coupling effect on the victim signal line.

5. The method of claim 3 further includes adding another attacker line in analyzing the cumulative cross-coupling effect, if the another attacker line has its signal switching point residing beyond the one time constant from the safety window, but is within another one time constant from an attacker signal which has its switching point residing within the one time constant from the safety window.

6. The method of claim 3 further includes adding cross-coupling effect of a second attacker line onto a first attacker line, the first attacker line having its signal switching point within the one time constant from the safety window and in which the second attacker line has its signal switching point within another one RC time constant of the switching point of the first attacker line.

7. The method of claim 6 further includes eliminating attacker signals which have a logic relationship which negate any cumulative cross-coupling effect caused by accumulating their individual cross-coupling effect.

8. The method of claim 7 wherein eliminating cumulative cross-coupling effect is achieved by eliminating attacker signals which have signal switching in opposite logical direction.

9. The method of claim 7 further includes determining a set of attacker signal or signals which causes a worst case signal noise on the victim line due to the accumulated cross-coupling effect.

10. The method of claim 9 further includes determining if the worst case signal noise exceeds a noise tolerance of a receiver coupled on the victim signal line.

11. The method of claim 10 wherein the receiver is selected from a plurality of receivers on the victim line and the selected receiver is most sensitive to cross-coupled noise on the victim signal line.

12. The method of claim 10 further includes ignoring noise effect caused by another attacker signal set which are not included in the worst case set.

13. The method of claim 12 further including adjusting layout topology of at least one of the attacker signal lines to reduce cross-coupled noise onto victim signal line.

* * * * *

UNITED STATES PATENT AND TRADEMARK OFFICE
CERTIFICATE OF CORRECTION

PATENT NO.     : 6,128,769
DATED          : October 3, 2000
INVENTOR(S)    : Carlson et al.

It is certified that error appears in the above-identified patent and that said Letters Patent is hereby corrected as shown below:

Column 5,
Line 52, delete "attacker$_{13}$ 1", insert -- attacker_1 --.

Signed and Sealed this

Seventeenth Day of December, 2002

JAMES E. ROGAN
*Director of the United States Patent and Trademark Office*